United States Patent [19]

Choi

[11] Patent Number: 4,954,795

[45] Date of Patent: Sep. 4, 1990

[54] SURFACE ACOUSTIC WAVE FILTER FOR SUPPRESSING SURFACE TO SURFACE INTERFERENCE FOR A SATELLITE COMMUNICATION RECEIVER

[75] Inventor: Young H. Choi, Seoul, Rep. of Korea

[73] Assignee: Samsung Electronics Co., Ltd., Rep. of Korea

[21] Appl. No.: 234,141

[22] Filed: Aug. 18, 1988

[30] Foreign Application Priority Data

Aug. 19, 1987 [KR] Rep. of Korea .............. 1987-9050

[51] Int. Cl.$^5$ .............................................. H03H 9/64
[52] U.S. Cl. ................................... 333/194; 333/196; 310/313 R; 310/313 B
[58] Field of Search ............. 333/150, 151, 153, 154, 333/193-196; 310/313 R, 313 B, 313 C, 313 D; 455/302, 306, 307

[56] References Cited

U.S. PATENT DOCUMENTS

| | | | |
|---|---|---|---|
| 3,777,274 | 12/1973 | Abraham | 333/150 X |
| 3,836,876 | 9/1974 | Marshall et al. | 310/313 D X |
| 3,889,065 | 6/1975 | Alsup | 333/150 X |
| 4,013,834 | 3/1977 | Kino et al. | 310/313 B X |
| 4,625,207 | 11/1986 | Skeie | 310/313 B X |

OTHER PUBLICATIONS

Lewis, M. F., "Surface—Acoustic Wave Filters Employing Symmetric Phase Weighted Transducers"; *Electronic Letters;* vol. 9, No. 6; 22 Mar. 1973; pp. 138-140.

*Primary Examiner*—Eugene R. LaRoche
*Assistant Examiner*—Benny Lee
*Attorney, Agent, or Firm*—Saidman, Sterne, Kessler & Goldstein

[57] ABSTRACT

A filter for suppressing surface to surface interference for a satellite communication receiver which utilizes a surface acoustic wave (SAW) element. The SAW filter comprises two inter-digital transducers for input and one inter-digital transducer for output, all three transducers are constructed and arranged on a piezoelectric substrate. The widths of the adjacent portions of electrodes and the spaces between the electrodes of the input inter-digital transducers are adjusted based upon the principle of a transversal filter so that the frequency responses of the input interdigital transducers have a predetermined band width and a reduced gain of a frequency range where an interference signal exists respectively.

5 Claims, 3 Drawing Sheets

SURFACE ACOUSTIC WAVE FILTER FOR SUPPRESSING SURFACE TO SURFACE INTERFERENCE FOR A SATELLITE COMMUNICATION RECEIVER

BACKGROUND OF THE INVENTION

1. Field of the Invention

The present invention relates to a filter for a satellite communication receiver, and more particularly, to a surface acoustic wave (SAW) filter for suppressing surface to surface interference with "C" band satellite communication signals for the region of 3.7 to 4.2 GHz.

2. Description of the Prior Art

In general, conventional filters for suppressing interference with satellite communication signals transmitted between earth stations are not installed inside of the satellite communication receiver, but are installed separately outside of the receiver.

This type of filter is a kind of notch filter which suppresses the frequency $f_N$ range where the interference signal exists in the intermediate frequency (IF) band, and is typically comprised of a tuning circuit utilizing an inductor coil and a capacitor (as shown in FIG. 1). When the operational frequency range is increased to the region of several GHz, the frequencies of the unnecessary regions are suppressed by other filters utilizing strip lines.

However, such conventional filters for suppressing the interference with communication signals between earth stations have some drawbacks in that the manufacturing process becomes complicated and the size of the filter increases. In the case of the filter for use in the IF band utilizing an inductor coil and a capacitor (as shown in FIG. 1), it is necessary to adjust the inductor coil and capacitor in order to select the frequency range to be suppressed. In the case of the filter utilizing strip lines, the size of the filter will be increased when this filter is used for the IF band. Therefore, such conventional filters cannot be installed within the satellite communication receiver but must be installed outside of the receiver.

SUMMARY OF THE INVENTION

It is an object of the present invention to provide a SAW filter for suppressing the surface to surface interference which can be installed within the satellite communication receiver.

It is another object of the present invention to provide a SAW filter which has a stabilized frequency response characteristic due to the geometric structure of two interdigital transducers (usually called "IDTs") deposited on a piezoelectric material which together form a SAW element.

It is still another object of the present invention to provide a SAW filter in which a tuning operation is unnecessary and thus the manufacturing process of the filter is simplified and the filter's size is reduced.

BRIEF DESCRIPTION OF THE DRAWINGS

The present invention will now be described by way of illustrative example with reference to the accompanying drawings, in which.

DESCRIPTION OF THE PREFERRED EMBODIMENTS

Figure 1:
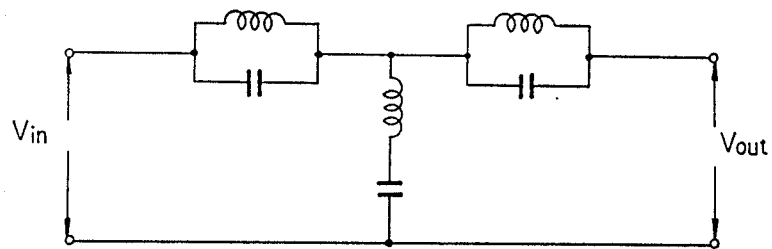
FIG. 1 is a schematic circuit diagram of the conventional filter for suppressing surface to surface interference.
Figure 2:
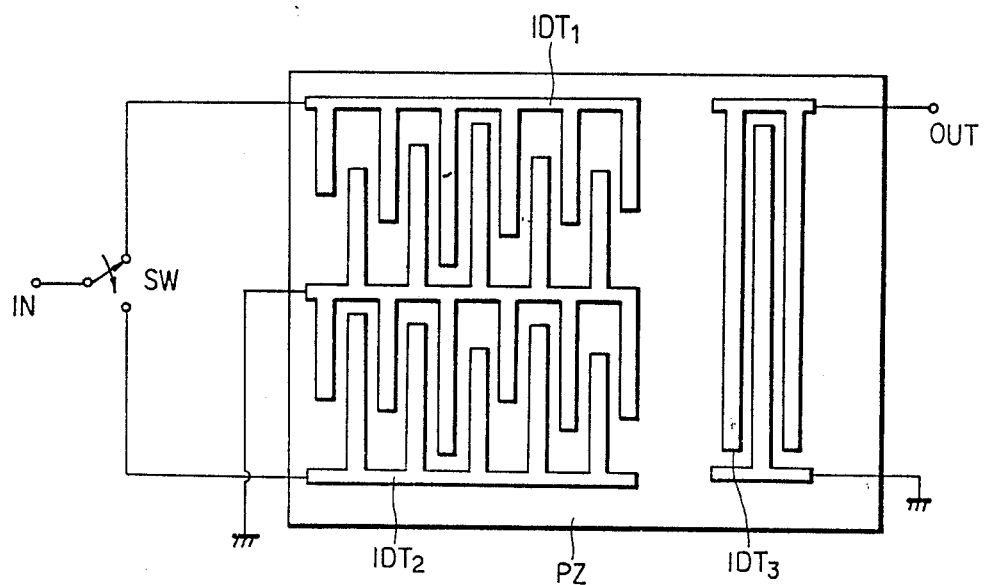
FIG. 2 shows a preferred embodiment of a SAW filter for suppressing surface to surface interference according to the present invention.

Referring to FIG. 2, a SAW filter for suppressing the surface to surface interference according to the present invention comprises two input interdigital transducers $IDT_1$ and $IDT_2$, and an output interdigital transducer $IDT_3$ deposited on a piezoelectric material PZ.

The input interdigital transducers $IDT_1$ and $IDT_2$ convert an electric signal applied to an input terminal IN into a mechanical deformation which is called a surface acoustic wave (SAW) and then the SAW propagates along the surface of the piezoelectric material.

The geometric structure of the input interdigital transducers $IDT_1$ and $IDT_2$ are varied so that one of the input interdigital transducers $IDT_1$ and $IDT_2$ acts as an IF band pass filter, and the other acts as a filter which has a frequency characteristic for suppressing the interference signal occurring between earth stations in the IF band.

The SAW propagating along the surface of the piezoelectric material is detected as the electric signal in the output interdigital transducer $IDT_3$.

A switch SW is connected between the input terminal IN and the input interdigital transducers $IDT_1$ and $IDT_2$ to switch the input signal into either of the input interdigital transducers $IDT_1$ and $IDT_2$. Therefore, the surface to surface interference can be suppressed according to the user's choice.

The input interdigital transducers $IDT_1$ and $IDT_2$ and the output interdigital transducer $IDT_3$ are designed and arranged on the piezoelectric material PZ based upon the principle of a transversal filter.

Figure 3:
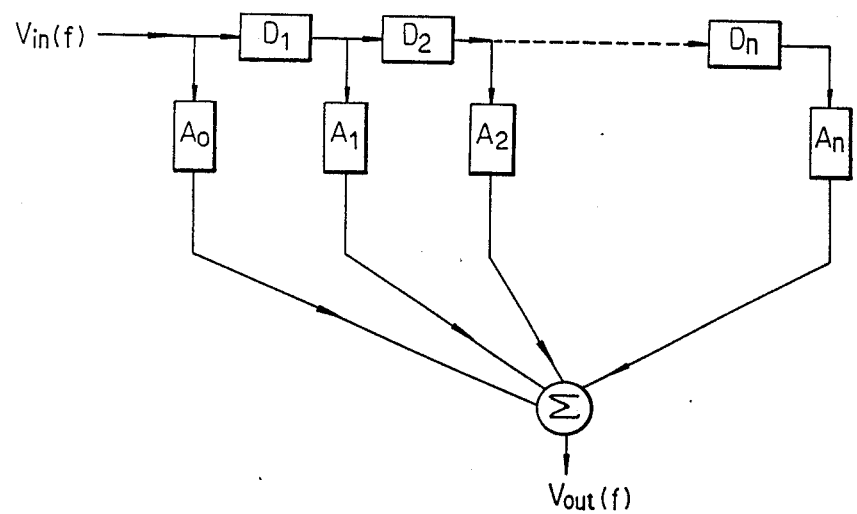
FIG. 3 is a schematic diagram of a transversal filter useful in understanding the principle of the present invention.

Referring now to FIG. 3, the basic construction of the transversal filter is shown. The output $V_{out}(f)$ with respect to an input $V_{in}(f)$ is expressed (as a function of frequency F) as follows:

$$V_{out}(f) = V_{in}(f) \sum_{n=1}^{N} A_n \exp(-j2\pi f D_n) \tag{1}$$

where $A_n$ are weighting coefficients, and $D_n$ are time delays.

Thus, the transfer function H(f) of the transversal filter from the equation (1) is given by $$H(f) = V_{out}(f)/V_{in}(f) = \sum_{n=1}^{N} A_n \exp(-j2\pi f D_n) \tag{2}$$

Figure 4:
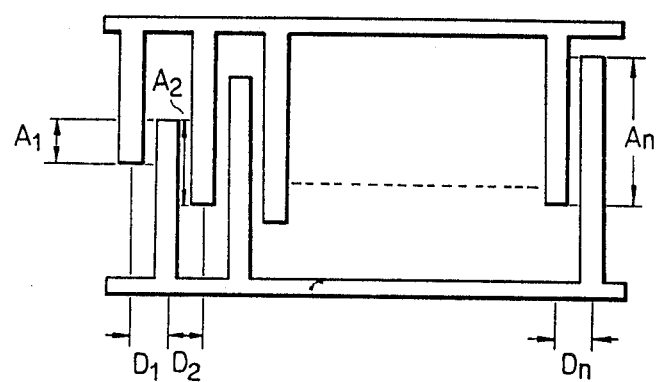
FIG. 4 shows input interdigital transducers according to the present invention.

In the disclosed embodiments, the input interdigital transducers $IDT_1$ and $IDT_2$ constituting the SAW element are designed and arranged based upon the equation (2) and the principle of the transversal filter shown in FIG. 3. The weighting coefficients $A_n$ in the case of the input interdigital transducers are determined by the widths of the adjacent portions of electrodes and the time delays $D_n$ are determined by adjusting the spaces between the electrodes respectively as shown in FIG. 4.

The desired frequency response H(f) can be obtained by adjusting the weighting coefficients $A_n$ and the time delays $D_n$. Thus, once the desired frequency response is determined, the weighting coefficients $A_n$ and the time delays $D_n$ are obtained according to the inverse Fourier transformation of the frequency response H(f).

Figure 5:
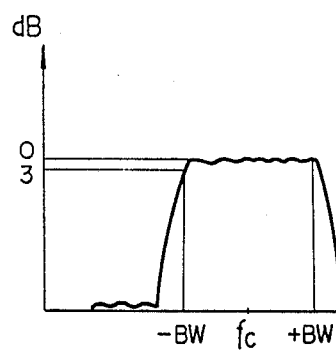
FIGS. 5a and 5b show the characteristic of the frequency response of the present invention.
Figure 5:
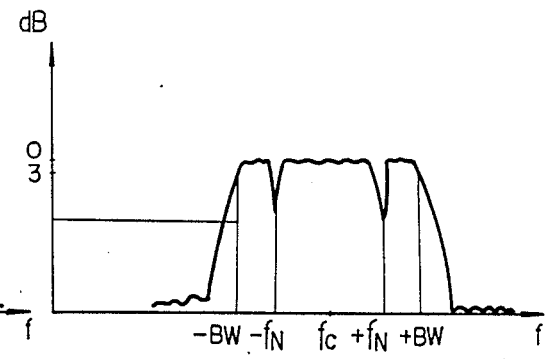

In designing the two input interdigital transducers $IDT_1$ and $IDT_2$ of the SAW filter for suppressing surface to surface interference, the geometric structure of the interdigital transducer $IDT_1$ is determined so that its frequency response has the band width of $-BW$ to $+BW$ with reference to the central frequency $f_c$ as shown in FIG. 5A, and the interdigital transducer $IDT_2$ is designed so that its frequency response has the band width of $-BW$ to $+BW$ with reference to the central frequency $f_c$ and has the characteristic that the gain of frequencies $-f_N$ and $+F_N$ where the interference signal exists is lower than approximately 15 dB in comparison with that of reference frequency as shown in FIG. 5B.

When the electric signal applied from the input terminal IN is switched into either of the input interdigital transducers $IDT_1$ and $IDT_2$ by means of the switch SW, the SAW generated from the input interdigital transducer $IDT_1$ or $IDT_2$ propagates along the surface of the piezoelectric material PZ, and in turn is detected again as the electric signal in the output interdigital transducer $IDT_3$.

The total frequency response $H_{TOT}(f)$ of the SAW element is given given by $$H_{TOT}(f) = H_1(f) \cdot H_{out}(f),$$

or $$H_{TOT}(f) = H_2(f) \cdot H_{out}(f)$$

where $H_1(f)$, $H_2(f)$ and $H_{out}(f)$ are the frequency responses of the input interdigital transducers $IDT_1$ and $IDT_2$ and the output interdigital transducer $IDT_3$ respectively.

Therefore, the total frequency response will be made equal to that of the input interdigital transducers by designing the input interdigital transducers to have the desired frequency response and the output interdigital transducer to have a wide band frequency response.

Figure 6:
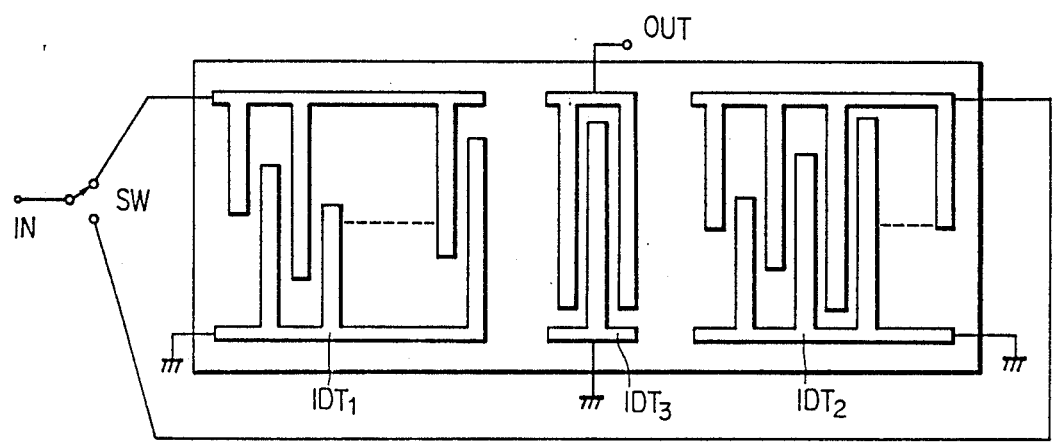
FIG. 6 shows another embodiment of a SAW filter according to the present invention.

Another embodiment of the present invention is shown in FIG. 6. In this embodiment, two input interdigital transducers $IDT_1$ and $IDT_2$ are positioned at each side of the output interdigital transducer $IDT_3$ respectively. The signal from the input terminal IN is switched into either of the input interdigital transducers $IDT_1$ and $IDT_2$ by the switch SW. The concrete design and the operating characteristic of this embodiment are the same as previously described embodiment.

As described above, it will be apparent that the present invention provides advantages such as small size, a stabilized frequency response and the simplification of the manufacturing process of filters for suppressing the interference between earth station since it is installed within the receiver together with the IF band pass filter and by adjusting the switch, it can be used both in places where interference signals (at output terminal OUT) exist and where such signals are absent.

What is claimed is:

1. A filter for suppressing surface to surface interference in an IF band of a satellite communication receiver, comprising:

a substrate of piezoelectric material for propagating a surface acoustic wave;

a first input interdigital transducer, having a first frequency response, disposed on the substrate for passing said IF band and generating said surface acoustic wave in response to an input signal applied thereto;

a second input interdigital transducer, having a second frequency response, disposed on the substrate for suppressing an interference signal in said IF band and generating said surface acoustic wave in response to said input signal applied thereto;

means for switching said input signal into either of said first and second input interdigital transducers; and an output interdigital transducer receiving said surface acoustic wave in said substrate;

wherein said first and second input interdigital transducers are so configured that said first frequency response of said first input interdigital transducer has a predetermined band width, and said second frequency response of said second input interdigital transducer has said predetermined band width, while having a reduced gain in a predetermined frequency range within said band width for suppressing said interference signal, wherein said first and second input interdigital transducers extend side by side along said substrate, and wherein said first and second input interdigital transducers include a common electrode structure.

2. A filter for suppressing surface to surface interference in an IF band of a satellite communication receiver, said filter comprising:

a substrate of piezoelectric material for propagating a surface acoustic wave;

first and second input interdigital transducers, each having at least one electrode, for respectively passing the IF band and suppressing an interference signal, said first and second input interdigital transducers generating said surface acoustic wave in response to an input signal applied thereto;

means for switching said input signal into either of said first and second input interdigital transducers;

and output interdigital transducer receiving said surface acoustic wave in said substrate and having a wide band frequency response characteristic;

wherein said electrodes have adjacent portions and spaces between said electrodes of said first and second input interdigital transducers have widths which are established in accordance with the equation $$V_{out}(f) = V_{in} \sum_{n=1}^{N} A_n$$

exp $(j2\pi f D_n)$, where $A_n$ represents weighing coefficients, and $D_n$ represents time delay so that said first input interdigital transducer has a frequency response of a predetermined band width, and said second input interdigital transducer has a frequency response of said predetermined band width and has a reduced gain in a frequency range where said interference signal exists.

3. A filter according to claim 2, wherein said first and second input interdigital transducers extend side by side along said substrate.

4. A filter according to claim 3, wherein said first and second input interdigital transducers include a common electrode structure.

5. A filter according to claim 2, wherein said first and second input interdigital transducers are spaced apart on the substrate and said output interdigital transducer is disposed on said substrate between said first and second input interdigital transducers.

* * * * *